United States Patent
Hiramoto et al.

(10) Patent No.: US 8,860,814 B2
(45) Date of Patent: Oct. 14, 2014

(54) SOLID-STATE IMAGING ELEMENT AND IMAGING DEVICE

(75) Inventors: Masao Hiramoto, Osaka (JP); Yoshiaki Sugitani, Nara (JP)

(73) Assignee: Panasonic Intellectual Property Corporation of America, Osaka (JP)

( * ) Notice: Subject to any disclaimer, the term of this patent is extended or adjusted under 35 U.S.C. 154(b) by 948 days.

(21) Appl. No.: 13/003,589

(22) PCT Filed: Mar. 2, 2010

(86) PCT No.: PCT/JP2010/001409
§ 371 (c)(1),
(2), (4) Date: Jan. 11, 2011

(87) PCT Pub. No.: WO2010/100897
PCT Pub. Date: Sep. 10, 2010

(65) Prior Publication Data
US 2011/0115919 A1    May 19, 2011

(30) Foreign Application Priority Data
Mar. 5, 2009   (JP) .................. 2009-051708

(51) Int. Cl.
H04N 5/33     (2006.01)
H04N 9/07     (2006.01)
H01L 27/146   (2006.01)
H04N 9/04     (2006.01)

(52) U.S. Cl.
CPC .............. H04N 9/045 (2013.01); H04N 9/07 (2013.01); H01L 27/14621 (2013.01); H04N 5/332 (2013.01); H01L 27/14627 (2013.01)
USPC ........... 348/164; 348/163; 257/227; 257/230; 257/232; 257/225; 257/229; 257/250

(58) Field of Classification Search
CPC .............. H01L 27/14621; H01L 27/14627; H04N 9/07; H04N 9/045; H04N 5/332; H04N 5/33; H04N 3/09; G01J 5/02
USPC ........................................... 348/164
See application file for complete search history.

(56) References Cited

U.S. PATENT DOCUMENTS 5,210,433 A * 5/1993 Ohsawa et al. ............... 257/250
5,416,345 A * 5/1995 Matsunaga ................... 257/222
(Continued)

FOREIGN PATENT DOCUMENTS

JP   02-264473 A   10/1990
JP   03-109769 A   5/1991
(Continued)

OTHER PUBLICATIONS

International Search Report for corresponding International Application No. PCT/JP2010/001409 mailed May 18, 2010.

Primary Examiner — Andy Rao
Assistant Examiner — Shan Elahi
(74) Attorney, Agent, or Firm — Renner, Otto, Boisselle & Sklar, LLP

(57) ABSTRACT

A solid-state image sensor according to the present invention includes a number of photosensitive cells $2b$, $2c$ that are arranged in between the first surface $30a$ of a semiconductor layer 30 and its second surface $30b$, which is opposite to the first surface $30a$ and which receives incoming light. As viewed from the photosensitive cells $2b$, $2c$, a reflecting portion $3a$ is arranged on the same side as the first surface $30a$ in order to reflect an infrared ray that has been transmitted through the photosensitive cell $2c$ and make it incident on one of the photosensitive cells $2b$, $2c$. As a result, the intensities of infrared rays to be converted photoelectrically by the photosensitive cells $2b$, $2c$ will be different from each other. And by calculating the difference between the photoelectrically converted signals supplied from the photosensitive cells $2b$, $2c$, the infrared ray component received by each photosensitive cell can be obtained. In addition, by arranging a color filter $1b$ on the same side as the second surface $30b$, an infrared ray component and a color component can be obtained at the same time.

9 Claims, 7 Drawing Sheets

(56) References Cited

U.S. PATENT DOCUMENTS

| | | | |
|---|---|---|---|
| 8,680,591 B2 * | 3/2014 | Haddad et al. | 257/291 |
| 8,698,084 B2 * | 4/2014 | Jiang et al. | 250/339.05 |
| 2006/0044429 A1 * | 3/2006 | Toda et al. | 348/272 |
| 2006/0188721 A1 * | 8/2006 | Irvin et al. | 428/402 |
| 2007/0059901 A1 * | 3/2007 | Majumdar et al. | 438/455 |
| 2009/0050855 A1 * | 2/2009 | Majumdar et al. | 252/500 |
| 2010/0118243 A1 * | 5/2010 | Majumdar et al. | 349/122 |
| 2011/0164156 A1 * | 7/2011 | Hiramoto et al. | 348/272 |

FOREIGN PATENT DOCUMENTS

| | | |
|---|---|---|
| JP | 11-317510 A | 11/1999 |
| JP | 2005-006066 A | 1/2005 |
| JP | 2006-054262 A | 2/2006 |

\* cited by examiner

*Fig. 13*

| G | B |
|---|---|
| R | IR |

SOLID-STATE IMAGING ELEMENT AND IMAGING DEVICE

TECHNICAL FIELD

The present invention relates to a solid-state image sensor that uses an infrared ray.

BACKGROUND ART

Recently, the performance and functionality of digital cameras and digital movie cameras that use some solid-state image sensor such as a CCD and a CMOS (which will be sometimes referred to herein as an "image sensor") have been enhanced to an astonishing degree. In particular, the size of a pixel structure for use in a solid-state image sensor has been further reduced these days thanks to rapid development of semiconductor device processing technologies, thus getting an even greater number of pixels and drivers integrated together in a solid-state image sensor. And the performance of image sensors has been further enhanced as well. Meanwhile, cameras that use a backside illumination type image sensor, which receives incoming light on its reverse side, not on its front side with a wiring layer for the solid-state image sensor, have been developed just recently and their property has attracted a lot of attention these days. An ordinary image sensor receives incoming light on its front side with the wiring layer, and therefore, no small part of the incoming light would be lost due to the presence of a complicated structure on the front side. In the backside illumination type image sensor, on the other hand, nothing in its photodetector section will cut off the incoming light, and therefore, almost no part of the incoming light will be lost by the device structure.

A camera that uses such a backside illumination image sensor would further expand the range of the image capturing environment. Also, recently, there is a growing demand for performing an image capturing session not just in the daytime but also at nighttime using an infrared ray. To meet such a demand, cameras that are dedicated to performing a shooting session at nighttime using a backside illumination image sensor or cameras that can be used both in the daytime and in the nighttime with the use of such a sensor could be put on the market sometime soon.

While the backside illumination image sensors are being developed, a lot of people have reported results of their researches on the device structures and manufacturing processes of such sensors. Meanwhile, it has also been researched rather extensively how such an image sensor should use the incoming light. For example, Patent Documents Nos. 1 and 2 disclose a technique for arranging an element with reflecting and condensing functions (such as a reflector or a concave mirror) on the principal surface of an image sensor in order to increase the sensitivity. According to such a technique, the light that has come through the back surface of the image sensor and has been transmitted through a photosensitive cell is made to be incident on the same photosensitive cell again, thereby attempting to increase the optical efficiency. On the other hand, Patent Document No. 3 discloses a technique for achieving the same object by getting the transmitted light reflected by a multilayer film. In any case, most of the light that has been transmitted through a photosensitive cell of an image sensor is an infrared ray due to the light absorbing property of silicon. That is why if the light that has once been transmitted through a photosensitive cell is made to be incident on the same photosensitive cell again, then the sensitivity to infrared rays, among other things, would increase.

As for a normal, non-backside-illumination image sensor (which will be referred to herein as a "frontside illumination image sensor"), a technique for obtaining a color signal and an infrared signal at the same time is disclosed in Patent Document No. 4, for example. According to Patent Document No. 4, color separation filters for transmitting light rays representing the respective colors of RGB and an infrared pass filter that transmits only an infrared ray (IR) are arranged in a matrix consisting of two columns and two rows as shown in FIG. 13 with respect to photosensitive cells of the image sensor. In this case, the RGB color filters can also transmit the infrared ray. That is why an infrared cut filter is arranged in front of each of those RGB color filters. With such an arrangement, the image capture device disclosed in Patent Document No. 4 produces a color image in the daytime by using the light rays that have been transmitted through the RGB color filters and produces a monochrome image in the nighttime by using an infrared ray that has been transmitted through the infrared filter as a light source. In this manner, by using an infrared cut filter in a part of the image capturing section, a color image and a monochrome image can be produced by using a visible radiation and an infrared ray, respectively.

CITATION LIST

Patent Literature

Patent Document No. 1: Japanese Patent Application Laid-Open Publication No. 2-264473
Patent Document No. 2: Japanese Patent Application Laid-Open Publication No. 3-109769
Patent Document No. 3: Japanese Patent Application Laid-Open Publication No. 2006-54262
Patent Document No. 4: Japanese Patent Application Laid-Open Publication No. 2005-6066

SUMMARY OF INVENTION

Technical Problem

As for how to use an infrared ray in an image sensor, there is a technique for making a light ray that has been once transmitted through a photosensitive cell incident on the same photosensitive cell again by using a reflective mirror in order to increase the optical efficiency. To produce an infrared image by such a technique, however, an infrared pass filter that transmits an infrared ray and absorbs a visible radiation should be used. Also available is a technique for performing an image capturing session in a broad wavelength range, which covers the visible radiation through infrared ray parts of the spectrum, by using four different types of color filters and infrared cut filter that transmit the RGB rays and the infrared ray (IR), respectively. To obtain a color image and an infrared image at the same time by such a technique, however, an infrared pass filter and an infrared cut filter both should be used.

It is therefore an object of the present invention to provide a technique for getting an infrared image without using any infrared pass filter or infrared cut filter in a backside or frontside illumination image sensor. Another object of the present invention is to provide a technique for obtaining a color image and an infrared image at the same time even without using such filters.

Solution to Problem

A solid-state image sensor according to the present invention includes: a semiconductor layer, which has a first surface and a second surface that is opposed to the first surface and that receives incoming light; a number of unit blocks, which are arranged two-dimensionally in between the first and second surfaces of the semiconductor layer and each of which includes first and second photosensitive cells; and a reflecting portion, which is arranged on the same side as the first surface of the semiconductor layer to reflect an infrared ray that has been transmitted through the first photosensitive cell in each unit block and to make that infrared ray incident on either the first or second photosensitive cell. One of the first and second photosensitive cells, which has received the infrared ray that has been reflected from the reflecting portion, outputs a photoelectrically converted signal, in which a component representing the intensity of the infrared ray that has been incident there after having been reflected by the reflecting portion has been added to the photoelectrically converted signal to be output by the other photosensitive cell.

In one preferred embodiment, the reflecting portion includes a number of infrared ray reflecting mirrors, each of which is arranged to face the first photosensitive cell in an associated one of the unit blocks.

In another preferred embodiment, each unit block further includes third and fourth photosensitive cells. The image sensor further includes first, second, third and fourth color separation filters, which are arranged on the same side as the second surface to face the first, second, third and fourth photosensitive cells, respectively. The first and second color separation filters transmit a visible light ray falling within a first wavelength range and the infrared ray in the incoming light received. The third color separation filter transmits a visible light ray falling within a second wavelength range and the infrared ray in the incoming light received. And the fourth color separation filter transmits a visible light ray falling within a third wavelength range and the infrared ray in the incoming light received.

In a specific preferred embodiment, the visible light rays falling within the first, second and third wavelength ranges are green, red and blue rays, respectively.

In still another preferred embodiment, each said unit block further includes third and fourth photosensitive cells. The solid-state image sensor further includes first and second color separation filters, which are arranged on the same side as the second surface to face the third and fourth photosensitive cells, respectively. The first color separation filter transmits a visible light ray falling within a first wavelength range and the infrared ray in the incoming light received, and the second color separation filter transmits a visible light ray falling within a second wavelength range and the infrared ray in the incoming light received.

In a specific preferred embodiment, the visible light rays falling within the first and second wavelength ranges are cyan and yellow rays, respectively.

In yet another preferred embodiment, the first, second, third and fourth photosensitive cells transmit a part of the incident infrared ray at a first ratio.

In yet another preferred embodiment, the solid-state image sensor further includes a light absorbing layer, which is arranged on the same side as the first surface of the semiconductor layer so as to absorb the infrared ray that has been transmitted through the second photosensitive cell in each unit block.

In yet another preferred embodiment, the solid-state image sensor further includes an interconnect layer, which is arranged on the same side as the first surface of the semiconductor layer.

An image capture device according to the present invention includes a solid-state image sensor and a signal processing section for processing an electrical signal supplied from the solid-state image sensor. The solid-state image sensor includes: a semiconductor layer, which has a first surface and a second surface that is opposed to the first surface and that receives incoming light; a number of unit blocks, which are arranged two-dimensionally in between the first and second surfaces of the semiconductor layer and each of which includes first and second photosensitive cells; and a reflecting portion, which is arranged on the same side as the first surface of the semiconductor layer to reflect an infrared ray that has been transmitted through the first photosensitive cell in each unit block and to make that infrared ray incident on either the first or second photosensitive cell. One of the first and second photosensitive cells, which has received the infrared ray that has been reflected from the reflecting portion, outputs a photoelectrically converted signal, in which a component representing the intensity of the infrared ray that has been incident there after having been reflected by the reflecting portion has been added to the photoelectrically converted signal to be output by the other photosensitive cell. The signal processing section calculates the intensity of the infrared ray received at each photosensitive cell by performing processing including calculating the difference between photoelectrically converted signals supplied from the first and second photosensitive cells.

Advantageous Effects of Invention

A solid-state image sensor according to the present invention includes a reflecting portion that reflects an infrared ray, which has been transmitted through one of two photosensitive cells, and that makes it incident on either photosensitive cell again. That is why the infrared rays to be converted photoelectrically by the two photosensitive cells should produce signals with mutually different intensities. And by calculating the difference between those two photoelectrically converted signals, the infrared ray components that have been received at the respective photosensitive cells can be obtained. Also, if color filters are used, RGB color signals can also be calculated by subtracting signals representing the infrared ray components from signals representing the intensities of the incoming light received at the photosensitive cells. As a result, an infrared image and a color image can be obtained even without using any infrared pass filter or cut filter.

BRIEF DESCRIPTION OF DRAWINGS

Figure 13:
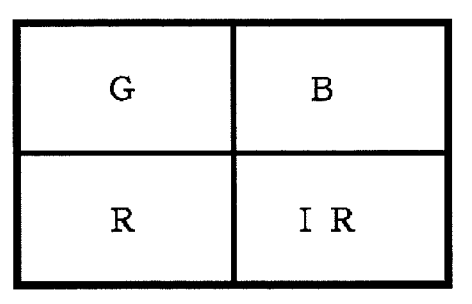

FIG. 13 illustrates a basic color arrangement for conventional color filters that are used to output color signals and an infrared ray signal at the same time.

DESCRIPTION OF EMBODIMENTS

First of all, it will be described basically how this invention works in principle before specific preferred embodiments of the present invention are described in detail.

Figure 1:
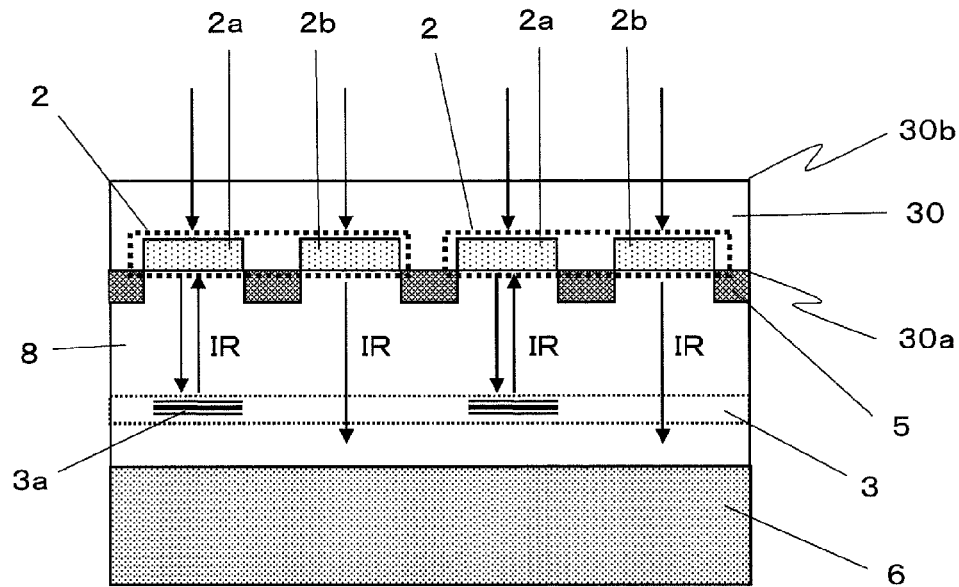
FIG. 1 is a cross-sectional view illustrating an exemplary solid-state image sensor according to the present invention.

FIG. 1 is a cross-sectional view illustrating an exemplary internal structure for a solid-state image sensor according to the present invention. As shown in FIG. 1, the solid-state image sensor includes a semiconductor layer 30, which has a first surface 30a and a second surface 30b that is opposite to the first surface 30a. Inside the semiconductor layer 30, arranged two-dimensionally are a lot of photosensitive cells (which will be sometimes referred to herein as "pixels") that form an array. The photosensitive cell array consists of a number of unit blocks 2, each of which includes photosensitive cells 2a and 2b. According to this arrangement, the photosensitive cells 2a and 2b can receive light (including a visible radiation and an infrared ray) that has come through the second surface 30b.

A reflecting portion 3 is arranged over the first surface 30a so as to face the photosensitive cell array. The reflecting portion 3 is arranged to reflect an infrared ray that has been transmitted through the photosensitive cell 2a and make it incident on either the photosensitive cell 2a or the photosensitive cell 2b. In the example illustrated in FIG. 1, the reflecting portion 3 includes an infrared ray reflecting mirror 3a, which is arranged in front of the photosensitive cell 2a so as to reflect the infrared ray that has been transmitted through the photosensitive cell 2a back toward the same cell 2a (i.e., make it incident on the photosensitive cell 2a again).

An interconnect layer 5 is arranged on the first surface 30a of the semiconductor layer 30. Also, as viewed from the photosensitive cell array, a transparent layer 8 and a substrate 6 to support the semiconductor layer 30 are stacked in this order over the first surface.

When light including a visible radiation and an infrared ray is incident on the photosensitive cells 2a and 2b, photoelectric conversion is produced by each of those photosensitive cells 2a and 2b, which outputs a photoelectrically converted signal representing the intensity of the light that has been converted photoelectrically. As measured along the optical axis of the incoming light, each photosensitive cell has a predetermined thickness. Each of those photosensitive cells is arranged so as to convert photoelectrically almost all of the visible radiation and a part of the infrared ray that are included in the incoming light and to just transmit the rest of the infrared ray.

The infrared ray that has been transmitted through the photosensitive cell 2a passes through the transparent layer 8, gets reflected by the infrared ray reflecting mirror 3a, and then enters the photosensitive cell 2a again. As a result, that reflected infrared ray produces another photoelectric conversion at the photodetector 2a. Meanwhile, the infrared ray that has been transmitted through the photosensitive cell 2b is supposed to pass through the transparent layer 8, enter the substrate 6 of the image sensor, and get absorbed there.

Suppose the intensities of the visible radiation and infrared ray that have been incident on one unit block 2 are identified by W and $IR_0$, respectively. According to the arrangement described above, first of all, the visible radiation with the intensity W and the infrared ray with an intensity $\Delta$ IR (<IR) are converted photoelectrically by the photosensitive cells 2a and 2b. On top of that, part of the infrared ray that has been reflected by the reflective mirror 3a and incident on the photosensitive cell 2a again and that has an intensity $\Delta$ IR' (<IR) is further photoelectrically converted by the photosensitive cell 2a. As a result, the photosensitive cell 2a outputs a photoelectrically converted signal S2a, of which the overall intensity is calculated by W+$\Delta$ IR+$\Delta$ IR'. On the other hand, the photosensitive cell 2b outputs a photoelectrically converted signal 2b, of which the overall intensity is calculated by W+$\Delta$ IR. That is to say, the photosensitive cell 2a outputs a photoelectrically converted signal S2a, which is obtained by adding a component representing the intensity of the extra infrared ray that has been reflected by the reflecting portion 3 and then incident on the photosensitive cell 2a again to the photoelectrically converted signal S2b to be output by the photosensitive cell 2b.

Figure 2:
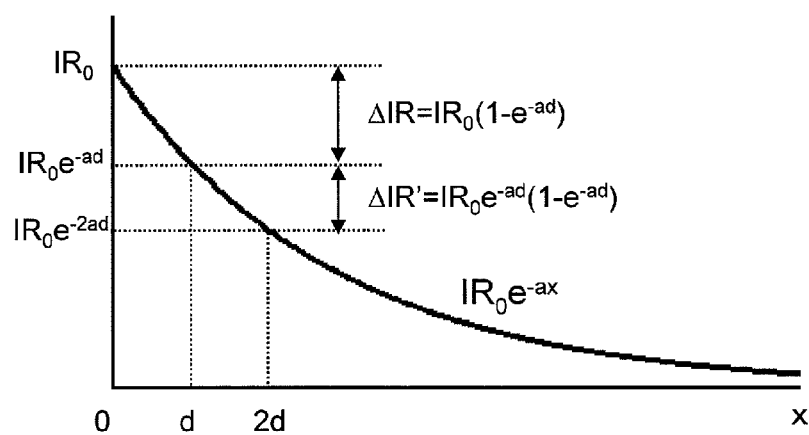
FIG. 2 shows how the intensity of an infrared ray transmitted varies with the thickness of a photosensitive cell.

Hereinafter, these intensities $\Delta$ IR and $\Delta$ IR' will be described in further detail with reference to FIG. 2, which shows how the intensity of an incoming infrared ray varies with the depth x as measured from the incident surface of a photosensitive cell. As shown in FIG. 2, as the depth as measured from the incident surface increases, the intensity of the infrared ray incident on a photosensitive cell decreases exponentially. Supposing the photosensitive cell has an infrared ray absorption coefficient a and the intensity of the incoming infrared ray is $IR_0$, the intensity IR of the infrared ray at a depth x is represented by the following Equation (1):

$$IR = IR_0 e^{-ax} \tag{1}$$

In this case, if the thickness of each of the photosensitive cells in the solid-state image sensor shown in FIG. 1 is represented by d, then the intensity of the infrared ray that has been just transmitted through the photosensitive cell 2b without being converted photoelectrically will be represented by $IR_0 e^{-ad}$. On the other hand, supposing that no loss were caused since the incoming infrared ray has been transmitted through the photosensitive cell 2a and until the same infrared ray enters the photosensitive cell 2a again, the intensity of the infrared ray to be eventually transmitted through the photosensitive cell 2a without being converted photoelectrically is represented by $IR_0 e^{-2ad}$. Consequently, $\Delta$ IR and $\Delta$ IR' are given by the following Equations (2) and (3), respectively:

$$\Delta IR = IR_0(1 - e^{-ad}) \tag{2}$$

$$\Delta IR' = IR_0 e^{-ad}(1 - e^{-ad}) \tag{3}$$

Thus, $\Delta$ IR and $\Delta$ IR' have mutually different values and $\Delta$ IR is smaller than $\Delta$ IR'.

Figure 3:
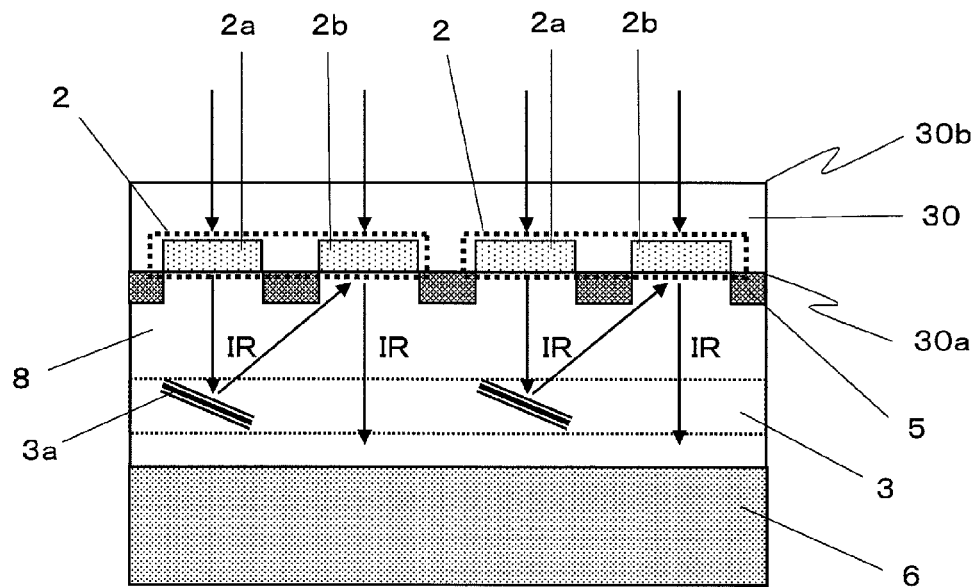
FIG. 3 is a cross-sectional view illustrating an example of an arrangement in which infrared ray reflecting mirrors are tilted.

In this example, the infrared ray reflecting mirror 3a is arranged so as to reflect the infrared ray that has been transmitted through the photosensitive cell 2a back and make it enter the photosensitive cell 2a again. However, the present invention is in no way limited to that specific preferred embodiment. For example, the infrared ray reflecting mirror 3a may also be tilted so as to reflect the infrared ray that has been transmitted through the photosensitive cell 2a and make it enter the photosensitive cell 2b. FIG. 3 illustrates an example of a solid-state image sensor with such a reflective mirror 3a. In such an arrangement, the infrared ray that has been reflected by the infrared ray reflecting mirror 3a and then just transmitted through the photosensitive cell 2b without being converted photoelectrically inside the photosensitive cell 2b has an optical path length that is greater than the thickness d of the photosensitive cell if the length is measured when the ray is passing through the photosensitive cell 2b. That is why in the example illustrated in FIG. 3, $\Delta$ IR' becomes greater than the value represented by Equation (3). Consequently, by adjusting the relative arrangement of the infrared ray reflecting mirror 3a and the photosensitive cells 2a and 2b, $\Delta$ IR' can be equalized with $\Delta$ IR. In the following description, the approximation $\Delta$ IR$\approx\Delta$ IR' is supposed to be satisfied for the sake of simplicity.

Supposing such an approximation is satisfied in the arrangement shown in FIG. 1, the photoelectrically converted signals S2a and S2b output by the photosensitive cells 2a and 2b are calculated by the following Equations (4) and (5), respectively:

$$S2a = Ws + 2\Delta IRs \quad (4)$$

$$S2b = Ws + \Delta IRs \quad (5)$$

In Equations (4) and (5), Ws and $\Delta$ IRs denote photoelectrically converted signals corresponding to the intensities W and $\Delta$ R, respectively, and 2 $\Delta$ IRS indicates that its magnitude is a double of $\Delta$ IRs. By subtracting S2b from S2a, $\Delta$ IRs can be obtained. $\Delta$ IRs should be proportional to the intensity $IR_0$ of the incoming infrared ray. That is why by calculating SIRS in each unit block, the distribution of $\Delta$ IRs in respective unit blocks, i.e., an infrared image, can be obtained. It should be noted that even if $\Delta$ IR$\approx\Delta$ IR' is not satisfied, $\Delta$ IRs can also be obtained based on Equations (2) and (3), and therefore, an infrared image can also be obtained in a similar manner. Based on the principle described above, the solid-state image sensor of the present invention can obtain an infrared image even without using any infrared pass filter.

Figure 4:
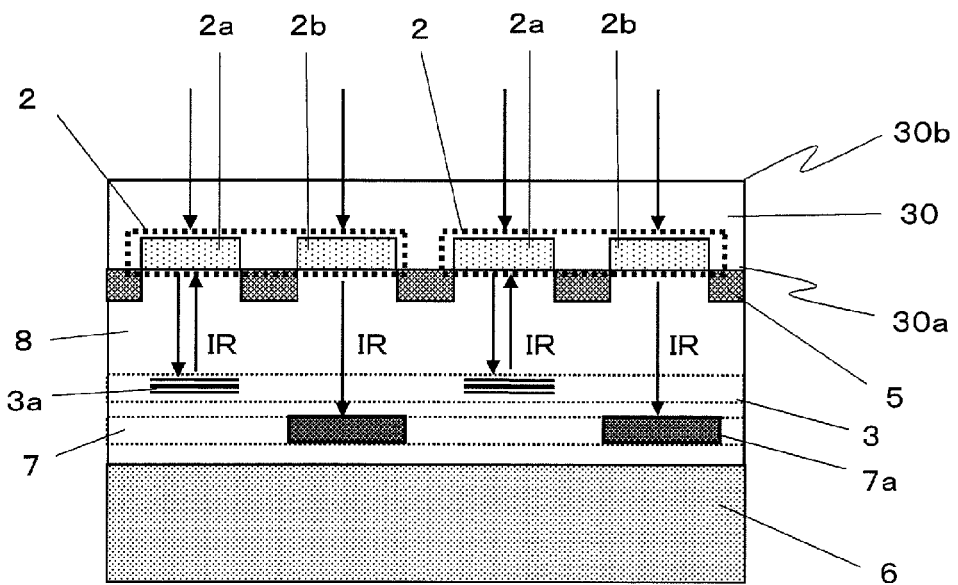
FIG. 4 illustrates an example of a solid-state image sensor with a light absorbing layer.

According to the present invention, the solid-state image sensor shown in FIG. 1 may further include a light absorbing layer for absorbing the light that has been transmitted through the photosensitive cell 2b. FIG. 4 illustrates an example of a solid-state image sensor with such a light absorbing layer 7. In the example illustrated in FIG. 4, the light absorbing layer 7 includes a light absorbing member 7a, which is arranged over the first surface 30a to face the photosensitive cell 2b. The light absorbing member 7a can prevent the infrared ray that has been transmitted through the photosensitive cell 2b from being retroreflected from the surface of the substrate 6 and entering the same photosensitive cell 2b again. Optionally, light absorbing members 7a may be arranged so as to face not just the photosensitive cells 2b but also photosensitive cells 2a as well. In that case, the light absorbing layer 7 should be arranged closer to the substrate 6 than the reflecting portion 3 is. Also, the light absorbing members 7a could absorb not only an infrared ray but also a visible radiation.

Figure 5:
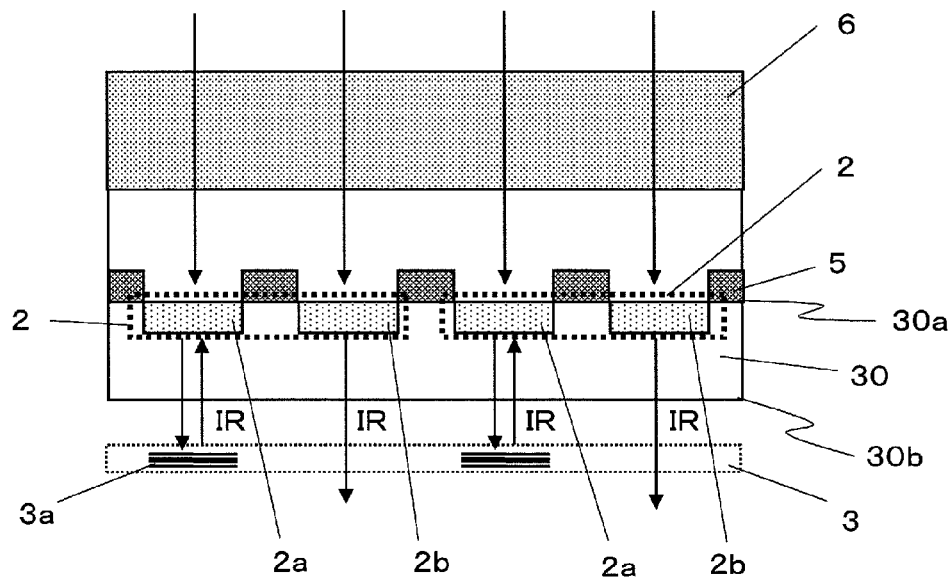
FIG. 5 is a cross-sectional view illustrating a frontside illumination solid-state image sensor with the arrangement of the present invention.

According to the present invention, the solid-state image sensor does not have to be the backside illumination type as shown in FIGS. 1, 3 and 4 but may also be a frontside illumination type. FIG. 5 is a cross-sectional view illustrating a frontside illumination solid-state image sensor with the arrangement of the present invention. According to this arrangement, the reflecting portion 3 is arranged on the same side as the second surface 30b so as not to face the photosensitive cell array. According to the present invention, the same effect would also be achieved even by such a frontside illumination image sensor.

Figure 6:
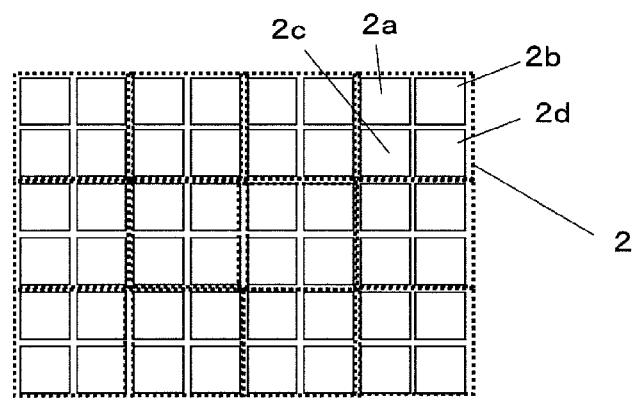
FIG. 6 is a top view schematically illustrating an exemplary arrangement of photosensitive cells according to the present invention.

According to the present invention, to obtain a color image as well as an infrared image, each unit block 2 should includes not just the photosensitive cells 2a and 2b but also other photosensitive cells as well. FIG. 6 is a top view schematically illustrating a part of such an array of photosensitive cells. In the arrangement illustrated in FIG. 6, each unit block 2 consists of four photosensitive cells 2a, 2b, 2c and 2d. However, this number of photosensitive cells per unit block 2 is only an example. On top of that, the photosensitive cell array does not have to have a tetragonal lattice arrangement like this but may also have any other arrangement. Furthermore, the photosensitive cells 2a, 2b, 2c and 2d shown in FIG. 6 may change their positions with each other and be arranged in any other pattern.

Also, to obtain a color image, color separation filters (which are often called simply "color filters") need to be arranged to face at least some of the photosensitive cells in each unit block 2 and to receive the incoming light. By arranging an appropriate combination of color filters, each of which is designed to pass a visible radiation falling within its associated wavelength range and an infrared ray, an infrared image and a color image can be obtained at the same time.

Suppose in the pixel arrangement shown in FIG. 6, red (R)-ray-passing and blue (B)-ray-passing color filters are arranged to face the photosensitive cells 2c and 2d, respectively. In that case, the photoelectrically converted signals S2c and S2d to be output by the photosensitive cells 2c and 2d are calculated by the following Equations (6) and (7), respectively:

$$S2c = Rs + \Delta IRs \quad (6)$$

$$S2d = Bs + \Delta IRs \quad (7)$$

In Equations (6) and (7), Rs and Bs denote signal components representing the R and B rays, respectively. If no color filters are arranged to face the photosensitive cells 2a and 2b, their photoelectrically converted signals S2a and S2b are calculated by Equations (4) and (5), respectively. $\Delta$ IRs, Rs, Bs and Ws can be obtained by Equations (4) through (7). By subtracting Rs and Bs from Ws thus obtained, a signal component Gs representing the green (G) ray can be obtained. By performing these signal calculations on each unit block 2 and obtaining $\Delta$ IRS, Rs, Bs and Gs on a unit block basis, a color image and an infrared image can be both obtained.

Hereinafter, specific preferred embodiments of the present invention will be described with reference to FIGS. 7 *through* 12. In the drawings and in the following description, any pair of components shown in multiple drawings or mentioned for multiple different embodiments and having substantially the same function will be identified by the same reference numeral.

(Embodiment 1)

Figure 7:
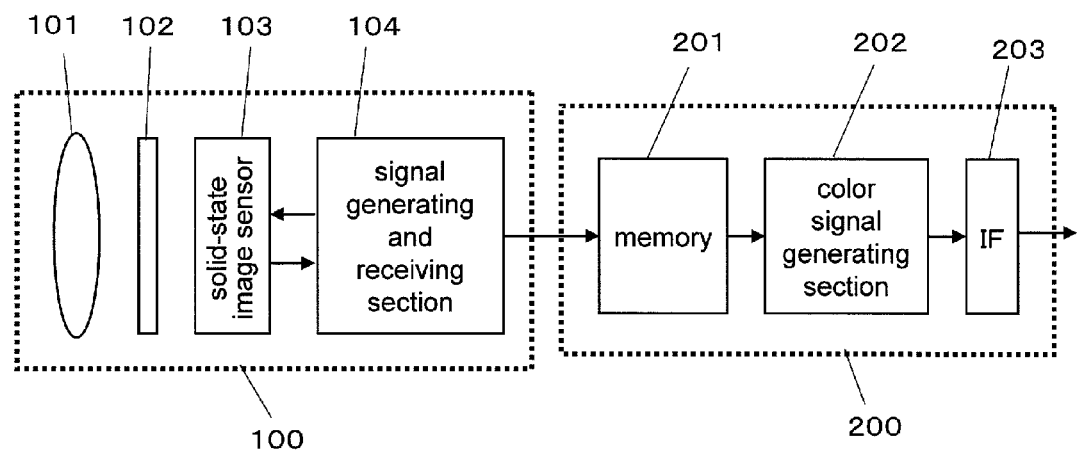
FIG. 7 is a block diagram illustrating an overall configuration for an image capture device as a first specific preferred embodiment of the present invention.

FIG. 7 is a block diagram illustrating an overall configuration for an image capture device as a first specific preferred embodiment of the present invention. The image capture device shown in FIG. 7 includes an image capturing section 100 and a signal processing section 200 that receives a signal from the image capturing section 100 and generates an image signal or a video signal. Hereinafter, the image capturing section 100 and the signal processing section 200 will be described.

The image capturing section 100 includes a lens 101 for imaging a given subject, an optical plate 102, a solid-state image sensor 103 for converting optical information, which has been collected by imaging the subject through the lens 101 and the optical plate 102, into an electrical signal by photoelectric conversion, and a signal generating and receiving section 104. In this case, the optical plate 102 includes a quartz crystal low-pass filter for reducing a moire pattern to be caused by a pixel arrangement. The signal generating and receiving section 104 generates a fundamental signal to drive the solid-state image sensor 103 and receives a signal from the solid-state image sensor 103 and passes it to the signal processing section 200.

The signal processing section 200 includes a memory 201 to store the signal supplied from the signal generating and receiving section 104, a color signal generating section 202 for generating a signal including color information and infrared ray information (i.e., a color signal) based on the data that has been read out from the memory 201, and an interface (IF) section 203 that outputs the color signal to an external device.

It should be noted that this configuration is only an example and that according to the present invention, all components but the solid-state image sensor 103 can be an appropriate combination of known elements. Hereinafter, a solid-state image sensor 103 according to this preferred embodiment will be described.

Figure 8:
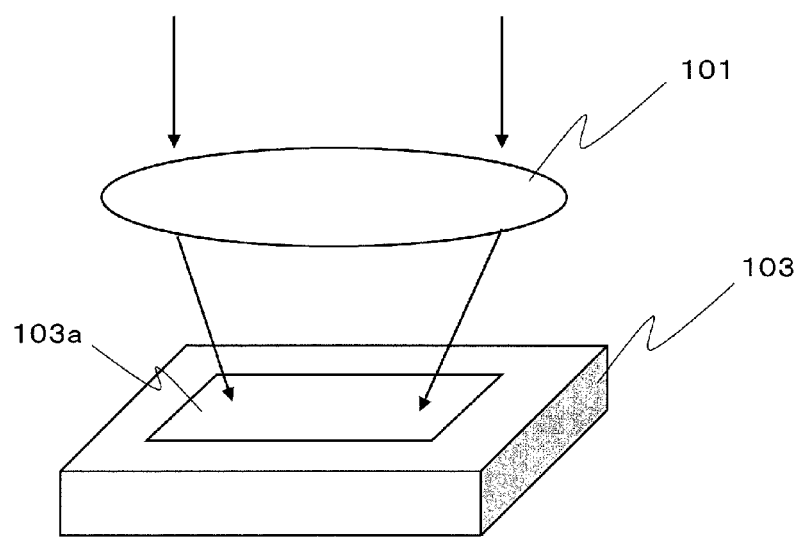
FIG. 8 is a perspective view illustrating how a lens and an image sensor are arranged according to the first preferred embodiment of the present invention.

FIG. 8 schematically illustrates how the light that has been transmitted through the lens 101 is incident on the solid-state image sensor 103. On the image capturing plane 103a of the solid-state image sensor 103, arranged two-dimensionally are a lot of photosensitive cells that form an array. Since the light is imaged by the lens 101, light (including a visible radiation and an infrared ray) strikes the image capturing plane 103a. The intensity of the light falling on the image capturing plane 103a (which will be referred to herein as an "incident light intensity") and the distribution of the incident light intensity according to the wavelength range vary with the point of incidence. Those photosensitive cells are typically photodiodes, each of which outputs an electrical signal representing the incident light intensity by photoelectric conversion (such a signal will be referred to herein as a "photoelectrically converted signal"). The solid-state image sensor 103 is typically implemented as a CCD or a CMOS sensor and is fabricated by known semiconductor device processing using a single crystalline semiconductor (e.g., silicon) as its material. The solid-state image sensor of this preferred embodiment is a backside illumination image sensor. However, the same effect will also be achieved by the present invention even if the image sensor is a frontside illumination type.

In the solid-state image sensor of this preferred embodiment, multiple color filters are arranged to face respective photosensitive cells. Each of those color filters is designed to transmit a visible radiation falling within a wavelength range that is associated with any of multiple color components and an infrared ray. In the following description, if a color component is identified by C, a color filter that transmits the color component C and an infrared ray will be referred to herein as a "C element".

Figure 9:
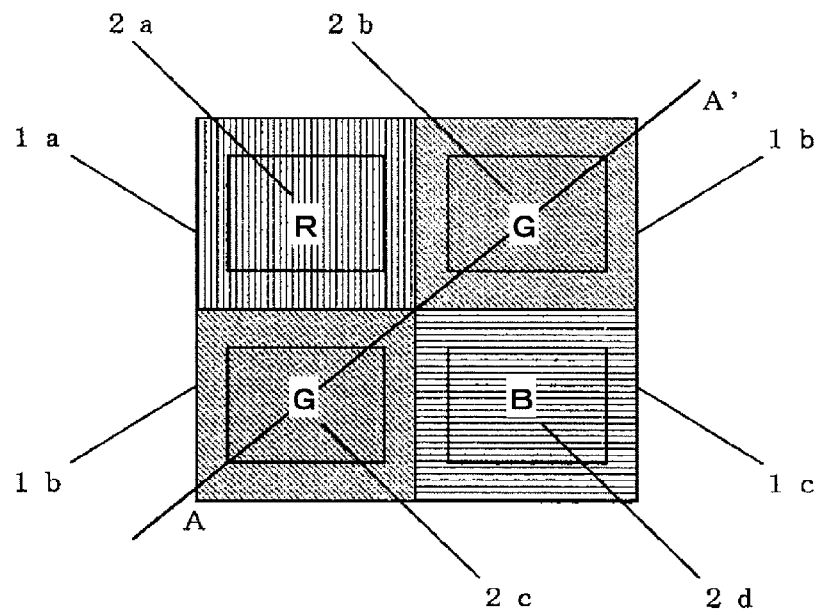
FIG. 9 is a plan view of an image sensor according to the first preferred embodiment of the present invention.

FIG. 9 illustrates the basic arrangement of color filters and photosensitive cells according to this preferred embodiment. In this preferred embodiment, the photosensitive cell array consists of a number of unit blocks that are arranged two-dimensionally, and each unit block consists of photosensitive cells 2a, 2b, 2c and 2d. In the arrangement shown in FIG. 9, the respective photosensitive cells are arranged in a tetragonal lattice pattern. However, the present invention is in no way limited to this specific preferred embodiment. Each of the photosensitive cells has its thickness defined so as to absorb almost all of the visible radiation and a part of the infrared ray and to convert them photoelectrically. Also, the respective photosensitive cells in a single unit block are designed to transmit infrared rays with almost the same intensity.

According to this preferred embodiment, Bayer color filters that use red (R), green (G) and blue (B) color elements is adopted. As shown in FIG. 9, red, green, green and blue elements 1a, 1b, 1b and 1c are arranged to face the photosensitive cells 2a, 2b, 2c and 2d, respectively.

Figure 10:
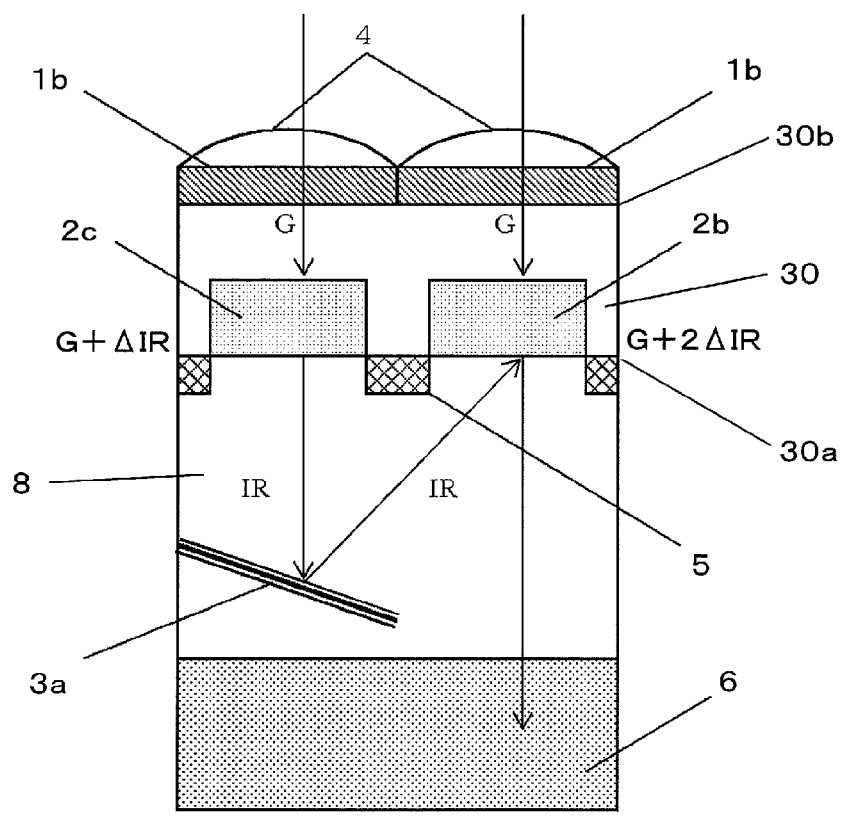
FIG. 10 is a cross-sectional view of the image sensor of the first preferred embodiment of the present invention as viewed on the plane A-A'.

FIG. 10 is a cross-sectional view as viewed on the plane A-A' shown in FIG. 9. As shown in FIG. 10, the solid-state image sensor includes a semiconductor layer 30, which has a first surface (i.e., principal surface) 30a and a second surface (i.e., a back surface) 30b. The photosensitive cells are arranged inside of the semiconductor layer 30. As viewed from the photosensitive cells, an interconnect layer 5, a transparent layer 8, and a substrate 6 that supports the semiconductor layer 30 and other members have been stacked in this order on the same side as the first surface 30a. Further arranged inside the transparent layer 8 is an infrared ray reflecting mirror 3a for reflecting an infrared ray, to say the least, so as to face the photosensitive cell 2c. More specifically, the infrared ray reflecting mirror 3a is arranged to reflect the infrared ray that has been transmitted through the photosensitive cell 2c and to make it incident on the photosensitive cell 2b. On the other hand, color filters 1a, 1b, 1b and 1c are arranged on the same side as the second surface 30b as viewed from the photosensitive cells. In addition, micro lenses 4 are further provided for the respective color filters 1a, 1b, 1b and 1c in order to condense the incoming light effectively onto the photosensitive cells.

The structure shown in FIG. 10 can be fabricated by known semiconductor device processing. To form such a structure, the following process may be carried out, for example. First of all, an array of photosensitive cells is formed in a surface region of a semiconductor substrate with a certain thickness, and then an interconnect layer 5, a transparent layer 8, infrared ray reflecting mirrors 3a and other members are arranged thereon. Subsequently, the semiconductor substrate and a transparent substrate 6 are bonded together with the transparent layer 8. Thereafter, the back surface side of the semiconductor substrate is polished or etched to have its thickness reduced to several micrometers, for example, thereby forming a semiconductor layer 30. After that, color filters 1a, 1b, 1c, micro lenses 3 and other members are arranged on the back surface side.

In such an arrangement, the incoming light including visible radiations and an infrared ray is transmitted through the micro lenses 4 and the color filters 1a, 1b and 1c, incident on the respective photosensitive cells, and then converted photoelectrically there. As described above, each of the photosensitive cells has its thickness defined so as to convert photoelectrically almost all of the visible radiation (i.e., from blue ray through red ray) and a part of the infrared ray with the intensity Δ IR. That is why the light transmitted through each photosensitive cell consists mostly of the infrared ray. The infrared rays that have been transmitted through the photosensitive cells 2a, 2b and 2d are then incident on the substrate 6 of the image sensor. On the other hand, the infrared ray that has been transmitted through the photosensitive cell 2c is reflected by the infrared ray reflecting mirror 3a, which is arranged right under the photosensitive cell 2c, toward the photosensitive cell 2b that is located diagonally to the mirror 3a and then incident on it. Consequently, the photosensitive cell 2b receives infrared rays, of which the overall intensity is twice as high as any other photosensitive cell's. As a result, the photosensitive cells 2a, 2b, 2c and 2d generate photoelectrically converted signals S2a through S2d represented by the following Equations (8) to (11):

$$S2a = Rs + \Delta IRs \quad (8)$$

$$S2b = Gs + 2\Delta IRs \quad (9)$$

$$S2c = Gs + \Delta IRs \quad (10)$$

$$S2d = Bs + \Delta IRs \quad (11)$$

where Rs, Gs, Bs and IRs denote the photoelectrically converted signals representing the red, green, blue and infrared rays, respectively.

According to this preferred embodiment, infrared rays with two different intensities are supposed to be received by the photosensitive cells associated with the green elements. Consequently, by calculating the difference between their intensities, an infrared ray component can be calculated. According to this preferred embodiment, by subtracting Equation (10) from Equation (9), the infrared ray component $\Delta$ IRs can be calculated as in the following Equation (12):

$$S2b - S2c = \Delta IRs \quad (12)$$

And by subtracting the infrared ray component $\Delta$ IRs from the photoelectrically converted signals generated by the respective photosensitive cells, RGB color components Rs, Gs and Bs can be calculated.

As described above, in the image sensor of this preferred embodiment, an infrared ray reflecting mirror 3a is arranged to reflect an infrared ray toward at least one of the two photosensitive cells that are arranged adjacent to each other to receive visible radiations representing the same color. By getting the infrared ray that has been transmitted through one photosensitive cell reflected by the infrared ray reflecting mirror 3a toward the other photosensitive cell and making it incident there, the intensities of the infrared rays received by the two photosensitive cells will be different from each other. As a result, by calculating their signal difference between those two photosensitive cells, the infrared ray component can be obtained. And by subtracting the infrared ray component from each pixel signal, RGB color signals can be obtained. The image capture device of this preferred embodiment can obtain an infrared image and a color image represented by visible radiations at the same time without using any infrared cut filter or infrared pass filter. Consequently, the present invention would achieve significant effects in practice.

In the preferred embodiment described above, the infrared ray reflecting mirror 3a is arranged to make an infrared ray that has been transmitted through the photosensitive cell 2c incident on the photosensitive cell 2b. However, the present invention is in no way limited to that specific preferred embodiment. Alternatively, the infrared ray reflecting mirror 3a may also be arranged parallel to the plane on which the photosensitive cells are arranged as an array to reflect an infrared ray, which has been transmitted through the photosensitive cell 2c, back to the same photosensitive cell 2c. Even so, an infrared image and a color image can also be obtained by calculating a signal difference between the two photosensitive cells 2b and 2c. Furthermore, the infrared ray reflecting mirror 3a does not have to be provided as a single element for each unit block. Instead, an infrared ray reflecting mirror 3a may also be broad enough to cover multiple unit blocks on the same plane. Optionally, the infrared ray reflecting mirror 3a could also be designed to reflect not only an infrared ray but also visible radiations as well. On top of that, the image sensor of this preferred embodiment may further include a light absorbing member, which is arranged on the same side as the first surface 30a so as to face the photosensitive cells 2a, 2b and 2d, in addition to every member of the preferred embodiment described above. By providing such a light absorbing member, it is possible to prevent the light that has been transmitted through each photosensitive cell from being reflected from the substrate 6, for example.

(Embodiment 2)

Hereinafter, a second preferred embodiment of the present invention will be described. The image capture device of the second preferred embodiment of the present invention is the same as the counterpart of the first preferred embodiment described above except the arrangement of color filters in its image sensor. Thus, the following description of the second preferred embodiment will be focused on only those differences from the first preferred embodiment to avoid redundancies.

Figure 11:
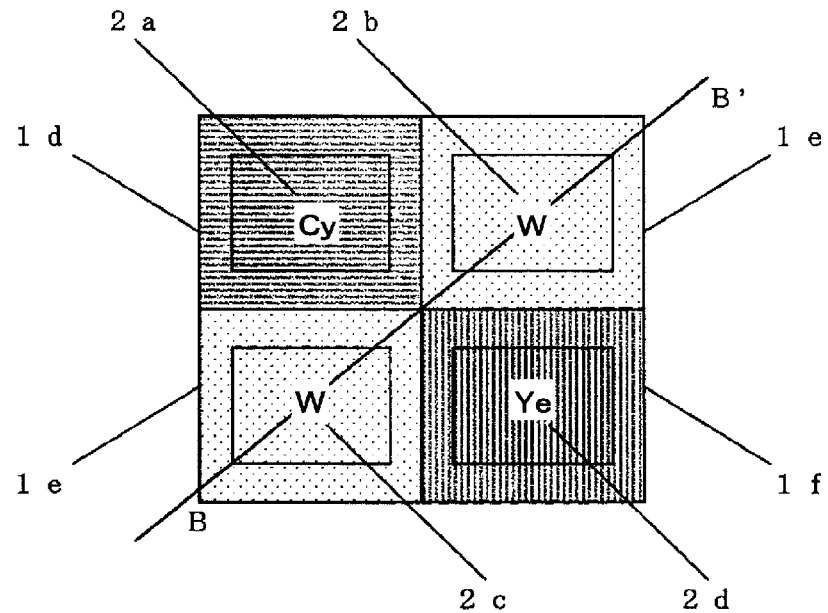
FIG. 11 is a plan view of an image sensor according to a second preferred embodiment of the present invention.

FIG. 11 illustrates the basic arrangement of color filters and photosensitive cells according to this preferred embodiment. In this preferred embodiment, the photosensitive cell array also consists of a number of unit blocks that are arranged two-dimensionally, and each unit block consists of photosensitive cells 2a, 2b, 2c and 2d. Each of the photosensitive cells has its thickness defined so as to absorb almost all of the visible radiation and a part of the infrared ray and to convert them photoelectrically. Also, the respective photosensitive cells in a single unit block are designed to transmit infrared rays with almost the same intensity.

In this preferred embodiment, color filters are arranged basically in a matrix consisting of two columns and two rows, which function as two transparent elements and two complementary color elements. As shown in FIG. 11, a cyan (Cy) element 1d, a transparent (W) element 1e, another transparent (W) element 1e, and a yellow (Ye) element 1f are arranged to face photosensitive cells 2a, 2b, 2c and 2d, respectively. These transparent elements 1e are designed to transmit visible radiations and infrared rays included in the incoming light. In the following description, the transparent elements 1e will also be counted among color filters.

Figure 12:
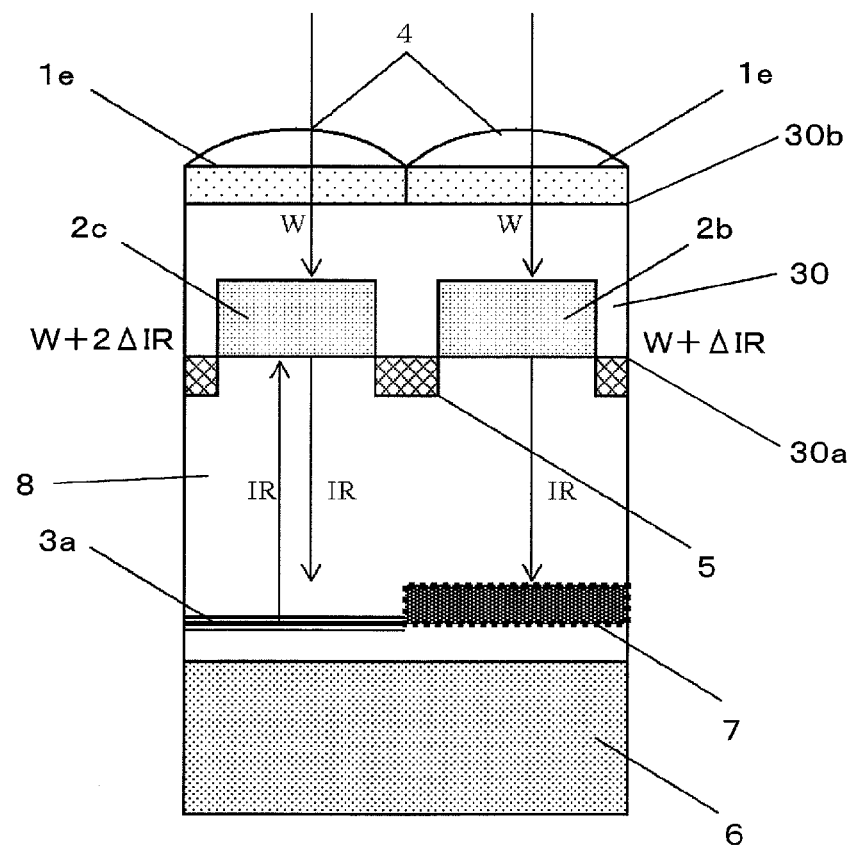
FIG. 12 is a cross-sectional view of the image sensor of the second preferred embodiment of the present invention as viewed on the plane B-B'.

FIG. 12 is a cross-sectional view as viewed on the plane B-B' shown in FIG. 11. The image sensor shown in FIG. 12 has the same structure as its counterpart shown in FIG. 10 except that an infrared ray reflecting mirror 3a is arranged parallel to the substrate 6 of the image sensor and that there is a light absorbing layer 7.

When the image sensor with such an arrangement receives light, which falls within the visible radiation range and the infrared range, from the subject, each photosensitive cell produces photoelectric conversion. Each of the photosensitive cells has its thickness defined so as to convert photoelectrically almost all of the visible radiation and a part of the infrared ray with the intensity $\Delta$ IR. That is why the respective photosensitive cells receive the infrared ray with the intensity $\Delta$ IR evenly. The infrared ray is once transmitted through the photosensitive cell 2c but is reflected by an infrared ray reflecting mirror 3a back to the same photosensitive cell 2c again. Consequently, the photosensitive cell 2c receives infrared rays, of which the overall intensity is twice as high as any other photosensitive cell's. Meanwhile, the infrared ray that has been transmitted through the photosensitive cell 2b is absorbed into the light absorbing layer 7 and is never reflected. As a result, the photosensitive cells 2a, 2b, 2c and 2d generate photoelectrically converted signals S2a through S2d represented by the following Equations (13) to (16):

$$S2a = Gs + Bs + \Delta IRs \quad (13)$$

$$S2b = Rs + Gs + Bs + \Delta IRs \quad (14)$$

$$S2c = Rs + Gs + Bs + 2\Delta IRs \quad (15)$$

$$S2d = Rs + Gs + \Delta IRs \quad (16)$$

Just like the image capture device of the first preferred embodiment described above, the image capture device of this preferred embodiment can also obtain the infrared ray component $\Delta$ IRs by calculating the differential signal between the photosensitive cells 2c and 2d. And by subtracting that component from the respective pixel signals, Ws (=Rs+Gs+Bs), Cs (=Gs+Bs) and Ys (=Rs+Gs) signals can be obtained. And by using the signals thus obtained, the Rs signal can be obtained by subtracting Cs from Ws, the Bs signal can be obtained by subtracting Ys from Ws, and the Gs signal can be obtained by subtracting Rs and Bs from Ws. In this manner, RGB color signals can be obtained.

As described above, according to this preferred embodiment, an infrared ray reflecting mirror 3a is arranged to reflect an infrared ray toward at least one of the two photosensitive cells that are arranged adjacent to each other to receive visible radiations representing the same color. By getting the infrared ray that has been transmitted through one photosensitive cell reflected by the infrared ray reflecting mirror 3a toward the same photosensitive cell and making it incident there, the intensities of the infrared rays received by the two photosensitive cells will be different from each other. As a result, by calculating their signal difference between those two photosensitive cells, the infrared ray component can be obtained. And by subtracting the infrared ray component from each pixel signal, RGB color signals can be obtained.

The image capture device of this preferred embodiment can obtain an infrared image and a color image represented by visible radiations at the same time without using any infrared cut filter or infrared pass filter. On top of that, the image sensor of this preferred embodiment uses transparent elements and color filters representing complementary colors, and therefore, would have higher sensitivity than its counterpart of the first preferred embodiment described above. Consequently, the present invention would achieve significant effects in practice.

In the preferred embodiment described above, the infrared ray reflecting mirror 3a is arranged to make an infrared ray that has been transmitted through the photosensitive cell 2c incident on the same photosensitive cell 2c again. However, the present invention is in no way limited to that preferred embodiment. Alternatively, the infrared ray reflecting mirror 3a may also be arranged so as to define a tilt angle with respect to the plane on which the photosensitive cells are arranged as an array to reflect an infrared ray, which has been transmitted through the photosensitive cell 2c, toward the photosensitive cell 2b and make it incident there. Even so, an infrared image and a color image can also be obtained by calculating a signal difference between the two photosensitive cells 2b and 2c. Furthermore, the infrared ray reflecting mirror 3a does not have to be provided as a single element for each unit block. Instead, the infrared ray reflecting mirror 3a may also be broad enough to cover multiple unit blocks on the same plane.

The light absorbing layer 7 of this preferred embodiment does not have to be provided as a single element for each unit block but may also cover multiple unit blocks as well. Furthermore, the light absorbing layer 7 is not an indispensable element for the present invention in the first place, and therefore, the effect of this preferred embodiment would also be achieved even without the light absorbing layer 7.

In each of the preferred embodiments of the present invention described above, the infrared ray reflecting mirror 3a that reflects an infrared ray to say the least should be arranged inside the image sensor. In the manufacturing process of a backside illumination image sensor, both the principal surface and back surface sides thereof need to be processed, and therefore, it is easier to introduce the process step of arranging such an infrared ray reflecting mirror into its manufacturing process than it is in the manufacturing process of a conventional frontside illumination image sensor. Consequently, the present invention is also applicable to a frontside illumination image sensor but can be used particularly effectively in a backside illumination image sensor, among other things.

INDUSTRIAL APPLICABILITY

The infrared ray receiving image capture device of the present invention can be used extensively in any infrared camera that uses a solid-state image sensor. For example, the present invention is applicable to cameras for general consumers including so-called "digital cameras" and "digital movie cameras", solid-state camcorders for TV broadcast personnel, industrial solid-state surveillance cameras, and so on.

REFERENCE SIGNS LIST 1a red element of color filter
1b green element of color filter
1c blue element of color filter
1d cyan element of color filter
1e transparent element
1f yellow element of color filter
unit block of photosensitive cell array
2a, 2b, 2c, 2d photosensitive cell of image sensor
3 reflecting portion
3a reflective mirror
4 micro lens
5 interconnect layer
6 substrate of image sensor
7 light absorbing layer
7a light absorbing member
8 transparent layer
30 semiconductor layer
30a first surface of semiconductor layer
30b second surface of semiconductor layer
100 image capturing section
101 optical lens
102 optical plate
103 image sensor
103a image capturing plane
104 signal generating and receiving section
200 signal processing section
201 memory
202 color signal generating section
203 interface section

The invention claimed is:

1. A solid-state image sensor comprising:
   a semiconductor layer which has a first surface and a second surface that is opposed to the first surface and that receives incoming light;
   a plurality of unit blocks which are arranged two-dimensionally in between the first and second surfaces of the semiconductor layer and each of which includes first and second photosensitive cells; and
   a reflecting portion which is arranged on the same side as the first surface of the semiconductor layer to reflect an infrared ray that has been transmitted through the first photosensitive cell in each said unit block and to make that infrared ray incident on either the first or second photosensitive cell, wherein one of the first and second photosensitive cells, which has received the infrared ray that has been reflected from the reflecting portion, outputs a photoelectrically converted signal, in which a component representing the intensity of the infrared ray that has been incident there after having been reflected by the reflecting portion has been added to the photoelectrically converted signal to be output by the other photosensitive cell, and wherein the reflecting portion includes a plurality of infrared ray reflecting mirrors, each of which is arranged to face the first photosensitive cell in an associated one of the unit blocks.

2. The solid-state image sensor of claim 1, wherein each said unit block further includes third and fourth photosensitive cells, and wherein the image sensor further includes first, second, third and fourth color separation filters, which are arranged on the same side as the second surface to face the first, second, third and fourth photosensitive cells, respectively, and wherein the first and second color separation filters transmit a visible light ray falling within a first wavelength range and the infrared ray in the incoming light received, and wherein the third color separation filter transmits a visible light ray falling within a second wavelength range and the infrared ray in the incoming light received, and wherein the fourth color separation filter transmits a visible light ray falling within a third wavelength range and the infrared ray in the incoming light received.

3. The solid-state image sensor of claim 2, wherein the visible light rays falling within the first, second and third wavelength ranges are green, red and blue rays, respectively.

4. The solid-state image sensor of claim 2, wherein the first, second, third and fourth photosensitive cells transmit a part of the incident infrared ray at a first ratio.

5. The solid-state image sensor of claim 1, wherein each said unit block further includes third and fourth photosensitive cells, and wherein the image sensor further includes first and second color separation filters, which are arranged on the same side as the second surface to face the third and fourth photosensitive cells, respectively, and wherein the first color separation filter transmits a visible light ray falling within a first wavelength range and the infrared ray in the incoming light received, and wherein the second color separation filter transmits a visible light ray falling within a second wavelength range and the infrared ray in the incoming light received.

6. The solid-state image sensor of claim 5, wherein the visible light rays falling within the first and second wavelength ranges are cyan and yellow rays, respectively.

7. The solid-state image sensor of claim 1, further comprising a light absorbing layer, which is arranged on the same side as the first surface of the semiconductor layer so as to absorb the infrared ray that has been transmitted through the second photosensitive cell in each said unit block.

8. The solid-state image sensor of claim 1, further comprising an interconnect layer, which is arranged on the same side as the first surface of the semiconductor layer.

9. An image capture device comprising
a solid-state image sensor, and
a signal processing section for processing an electrical signal supplied from the solid-state image sensor,
wherein the solid-state image sensor includes:
a semiconductor layer which has a first surface and a second surface that is opposed to the first surface and that receives incoming light;
a plurality of unit blocks which are arranged two-dimensionally in between the first and second surfaces of the semiconductor layer and each of which includes first and second photosensitive cells; and
a reflecting portion, which is arranged on the same side as the first surface of the semiconductor layer to reflect an infrared ray that has been transmitted through the first photosensitive cell in each said unit block and to make that infrared ray incident on either the first or second photosensitive cell,
wherein one of the first and second photosensitive cells, which has received the infrared ray that has been reflected from the reflecting portion, outputs a photoelectrically converted signal, in which a component representing the intensity of the infrared ray that has been incident there after having been reflected by the reflecting portion has been added to the photoelectrically converted signal to be output by the other photosensitive cell,
wherein the signal processing section calculates the intensity of the infrared ray received at each said photosensitive cell by performing processing including calculating the difference between photoelectrically converted signals supplied from the first and second photosensitive cells, and
wherein the reflecting portion includes a plurality of infrared ray reflecting mirrors, each of which is arranged to face the first photosensitive cell in an associated one of the unit blocks.

\* \* \* \* \*

UNITED STATES PATENT AND TRADEMARK OFFICE
CERTIFICATE OF CORRECTION

PATENT NO. : 8,860,814 B2  
APPLICATION NO. : 13/003589  
DATED : October 14, 2014  
INVENTOR(S) : Masao Hiramoto and Yoshiaki Sugitani Page 1 of 1

It is certified that error appears in the above-identified patent and that said Letters Patent is hereby corrected as shown below:

On the title page item (73) Assignee: "Panasonic Intellectual Property Corporation of America, Osaka (JP)", should read -- Panasonic Intellectual Property Corporation of America, Torrance, CA (US) --

Signed and Sealed this  
Twentieth Day of October, 2015

Michelle K. Lee  
*Director of the United States Patent and Trademark Office*